United States Patent [19]
Kim

[11] Patent Number: 6,118,174
[45] Date of Patent: Sep. 12, 2000

[54] BOTTOM LEAD FRAME AND BOTTOM LEAD SEMICONDUCTOR PACKAGE USING THE SAME

[75] Inventor: Dong-You Kim, Cheongju, Rep. of Korea

[73] Assignee: LG Semicon Co., Ltd., Cheongju, Rep. of Korea

[21] Appl. No.: 08/992,782

[22] Filed: Dec. 17, 1997

[30] Foreign Application Priority Data

Dec. 28, 1996 [KR] Rep. of Korea ............ 96-75054

[51] Int. Cl.[7] ................ H01L 23/495; H01L 23/50
[52] U.S. Cl. ............. 257/676; 257/666; 257/668; 257/692; 257/696
[58] Field of Search ............. 257/676, 666, 257/668, 692, 693, 696

[56] References Cited

U.S. PATENT DOCUMENTS

| | | | |
|---|---|---|---|
| 5,428,248 | 6/1995 | Cha | 257/676 |
| 5,606,199 | 2/1997 | Yoshigai | 257/692 |
| 5,770,888 | 6/1998 | Song et al. | 257/696 |
| 5,804,874 | 9/1998 | An et al. | 257/676 |
| 5,824,950 | 10/1998 | Mosley et al. | 257/678 |
| 5,926,376 | 7/1999 | Cho | 257/723 |

*Primary Examiner*—Leo P. Picard
*Assistant Examiner*—Hung Van Duong
*Attorney, Agent, or Firm*—Fleshner & Kim

[57] ABSTRACT

A bottom lead frame and a bottom lead semiconductor package embodying the invention are capable of forming a multiple row pin structure. The bottom lead frame includes a plurality of first leads, and a plurality of second leads, where each lead has a bottom lead portion and an inner lead portion that is upwardly bent from the bottom lead portion. The first leads and second are arranged on opposite sides of a central portion. Each of the first leads is inserted between a pair of neighboring second leads. The bottom portions of the second leads are arranged outwardly of the bottom portions of the first leads. A lead support bar may be connected to the inner portions of the first and second leads to support the first and second leads. A semiconductor chip may be mounted on upper surfaces of either the first or the second leads.

26 Claims, 4 Drawing Sheets

BOTTOM LEAD FRAME AND BOTTOM LEAD SEMICONDUCTOR PACKAGE USING THE SAME

BACKGROUND OF THE INVENTION

1. Field of the Invention

The present invention relates to a lead frame and a package, and more particularly a bottom lead frame and a bottom lead semiconductor package using the same.

2. Description of the Related Art

Semiconductor packages are typically classified into a small outline package (SOP), a small outline J-leaded package (SOJ), a quad flat package (QFP), etc. The common characteristic of the above-described semiconductor packages are that inner leads, through which external connections are made to a chip, project from the package body.

In the conventional semiconductor packages, there are problems in that an area occupied by the packages is relatively large compared to the size of the substrate because the inner leads extend laterally from the sides of the package body. Also, the semiconductor packages are often harmed when mounting the chip on the substrate, thus increasing a defective package ratio, since the inner leads are easily bent.

U.S. Pat. No. 5,428,248 of the same assignee as this application is directed to overcoming the above-described problems. The semiconductor package disclosed in U.S. Pat. No. 5,428,248 is known in the industry as a Bottom Lead Semiconductor Package (BLP). The disclosure of U.S. Pat. No. 5,428,248 is incorporated by reference herein. FIG. 1 illustrates a typical bottom lead semiconductor package. As shown therein, the bottom lead semiconductor package includes a lead frame 13 having a plurality of bottom leads 11, the lower surfaces of which are capable of being connected with a substrate or circuit board (not shown). The bottom leads 11 extend to form inner leads 12, which are upwardly bent from the bottom leads 11. A semiconductor chip 15 is fixed to the upper surfaces of the bottom leads 11 by an adhesive material 14. A plurality of conductive wires 16 electrically connect to a plurality of chip pads 10 of the semiconductor chip 15 and the inner leads 12 of the lead frame 13. The conductive wires 16, the semiconductor chip 15, the bottom leads 11 and the inner leads 12 of the lead frame 13 are packaged in a molding resin 17, except for the lower surfaces of the bottom leads 11, which are exposed to the outside of the package body. The exposed bottom leads 11 may be covered by a lead coating 18.

In the bottom lead semiconductor package described above, the size of the chip package increases as the number of leads increases, resulting in an increase in the substrate occupying area. Such increase is disadvantageous.

SUMMARY OF THE INVENTION

Accordingly, it is an object of the present invention to provide a lead frame and a chip package using the same which overcome the aforementioned problems encountered in the conventional art.

It is another object of the present invention to provide an improved lead frame and a chip package using the same which are capable of forming a multiple pin structure of a chip package.

It is a further object of the present invention to provide a bottom lead frame and a bottom lead semiconductor package using the same, wherein inner leads extend from multiple rows of leads arranged on the lower surface of a package body.

To achieve the above objects, a bottom lead frame embodying the invention includes a plurality of first leads, each having a bottom lead portion and an inner lead portion. The first leads are arranged opposing both sides of a central space. The lead frame also includes a plurality of second leads, each having a bottom lead portion arranged outwardly of the bottom lead portion of the first leads, and an inner lead portion upwardly bent from the bottom lead portion. Said first leads are inserted between neighboring second leads. A lead support bar of the lead frame connects the inner lead portions of the first and second leads at each side of the central area to support the leads.

To achieve the above objects, a bottom lead semiconductor package embodying the invention includes: a plurality of first leads arranged to oppose one another on both sides of a central portion of the package, each lead having a bottom lead portion and an inner lead portion bent upwardly and outwardly therefrom; a plurality of second leads each having a bottom lead portion arranged outwardly of the bottom lead portions of the first leads and an inner lead portion upwardly bent from the bottom lead portion, wherein each of said second leads are inserted between neighboring first leads, respectively; a semiconductor chip mounted on the upper surfaces of the bottom or inner lead portions of the first or second leads by an insulating adhesive material; a plurality of conductive wires for electrically connecting the semiconductor chip with the inner lead portions of the first and second leads; and a molding portion for encapsulating the entire construction while exposing lower surfaces of the bottom lead portions of the first and second leads.

Additional advantages, objects and features of the invention will become apparent from the description which follows.

BRIEF DESCRIPTION OF THE DRAWINGS

The present invention will become more fully understood from the detailed description given hereinbelow and the accompanying drawings, wherein like elements are identified by like reference numbers, and wherein.

DETAILED DESCRIPTION OF PREFERRED EMBODIMENTS

Figure 1:
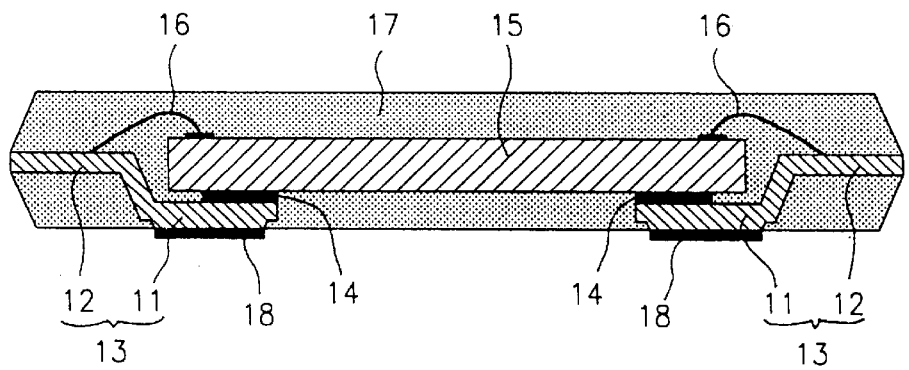
FIG. 1 is a vertical cross-sectional view illustrating a related art bottom lead semiconductor package.
Figure 2:
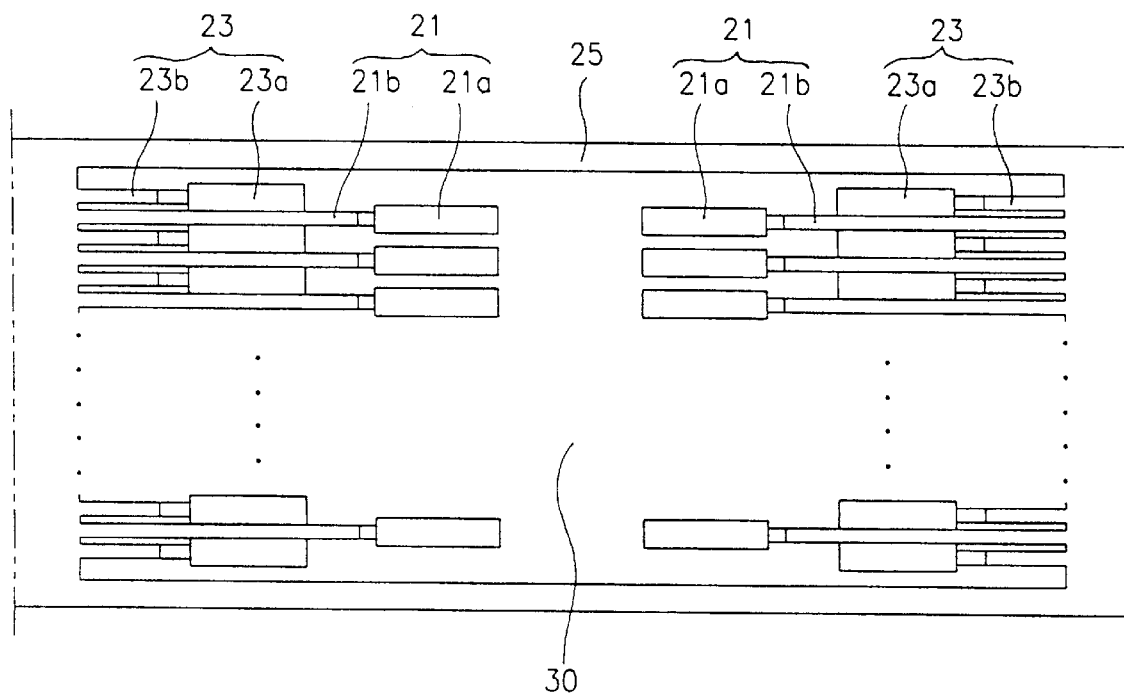
FIG. 2 is a plan view illustrating a bottom lead frame embodying the present invention.
Figure 3:
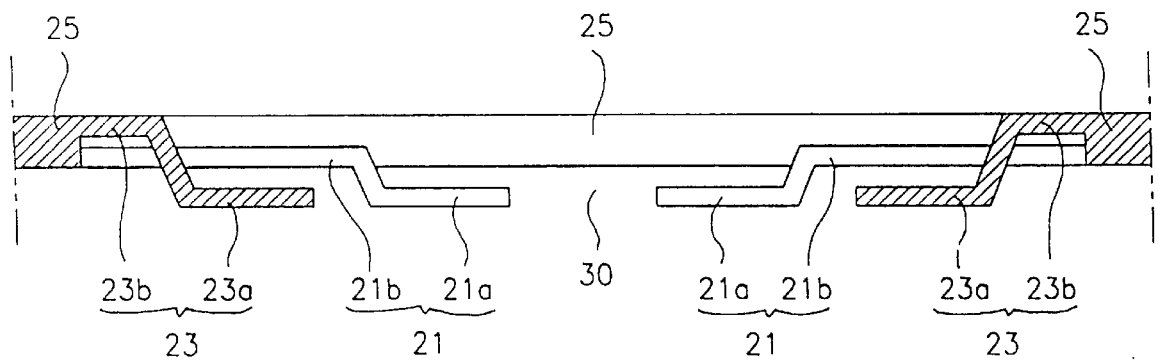
FIG. 3 is a cross-sectional view taken along line III—III of FIG. 2.

A lead frame embodying the invention will be described with reference to FIGS. 2 and 3. As shown in FIGS. 2 and 3, a plurality of first leads 21 of a bottom lead frame embodying the invention are arranged opposite one another on both sides of a center space 30. Each of the first leads 21 includes a bottom lead portion 21a and an inner lead portion 21b. The bottom lead portions 21a oppose each other at both sides of the center space 30. The inner lead portions 21b are upwardly bent from the bottom lead portions 21a.

The lead frame also includes a plurality of second leads 23, which are inserted between neighboring first leads 21. Each of the second leads 23 includes a bottom lead portion 23a and an inner lead portion 23b. The bottom lead portions 23a of the second leads 23 are arranged outwardly of the bottom lead portions 21a of the first leads 21. The inner lead portions 23b are upwardly bent from the bottom lead portions 23a, and extend higher than the inner lead portions 21b of the first leads 21. In addition, a lead support bar 25 contacts and supports the inner lead portions 21b and 23b of both the first and second leads 21 and 23.

As shown in FIG. 2, the widths of the bottom lead portions 21a and 23a are wider than the widths of the inner lead portions 21b and 23b. Therefore, the lower surface area of the bottom lead portions 21a and 23a may be identical to the lower surface area of leads of related art bottom lead semiconductor packages (BLPs). In an alternative embodiment, the bottom lead portions 21a, 23a may even be larger than the lower surfaces of leads of related art BLPs, allowing a better electrical connection with an external circuit or substrate. The widths of the bottom lead portions 21a and 23a and the inner lead portions 21b and 23b are different such that the wire bonding area of the inner lead portions 21b and 23b is smaller than the soldering area of the bottom lead portions 21a and 23a.

Figure 4:
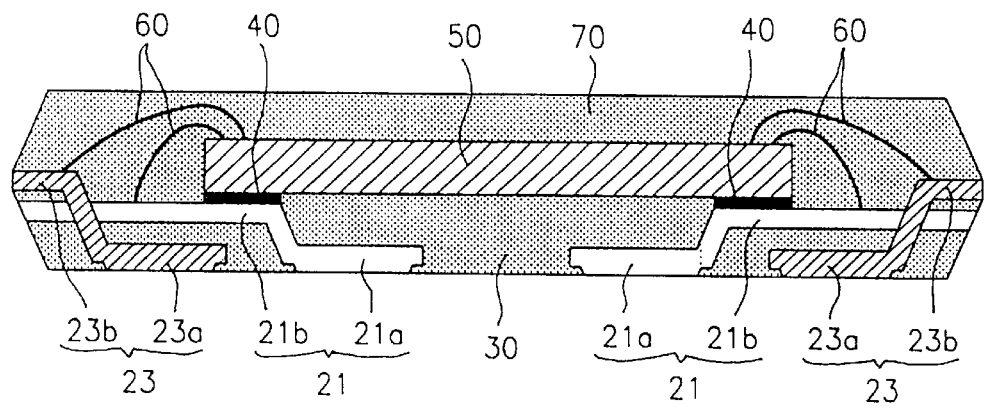
FIG. 4 is a vertical cross-sectional view illustrating a bottom lead semiconductor package embodying the present invention.

FIG. 4 illustrates a bottom lead semiconductor package according to the present invention. As shown therein, a plurality of first leads 21 are arranged opposite one another on both sides of a center space 30. Each of the first leads 21 includes a bottom lead portion 21a and an inner lead portion 21b. The inner lead portions 21b are upwardly bent from the bottom lead portions 21a. In addition, as shown in FIG. 2, a second lead 23 is inserted between neighboring first leads 21, respectively. As shown in FIG. 4, each of the second leads 23 includes a bottom lead portion 23a and an inner lead portion 23b. The bottom lead portions 23a of the second leads 23 are arranged outwardly of the bottom lead portions 21a of the first leads 21. The inner lead portions 23b are upwardly bent from the bottom lead portions 23a and extend higher than the inner lead portions 21b of the first leads 21.

A semiconductor chip 50 is mounted on the upper surface of the inner lead portions 21b of the first leads 21 by an electrically insulating adhesive material 40. Bonding pads (not shown) on the semiconductor chip 50 and corresponding portions of the inner lead portions 21b and 23b are connected by a plurality of conductive wires 60. In addition, the semiconductor chip 50, the first leads 21, the second leads 23, and the wires 60 are packaged by an epoxy molding portion 70, for protecting the internal elements. When forming the molding portion 70, at least the lower surfaces of the bottom lead portions 21a and the bottom lead portions 23a are exposed to the outside of the package body. As shown, the semiconductor chip is not mounted on the second leads 23.

Figure 5:
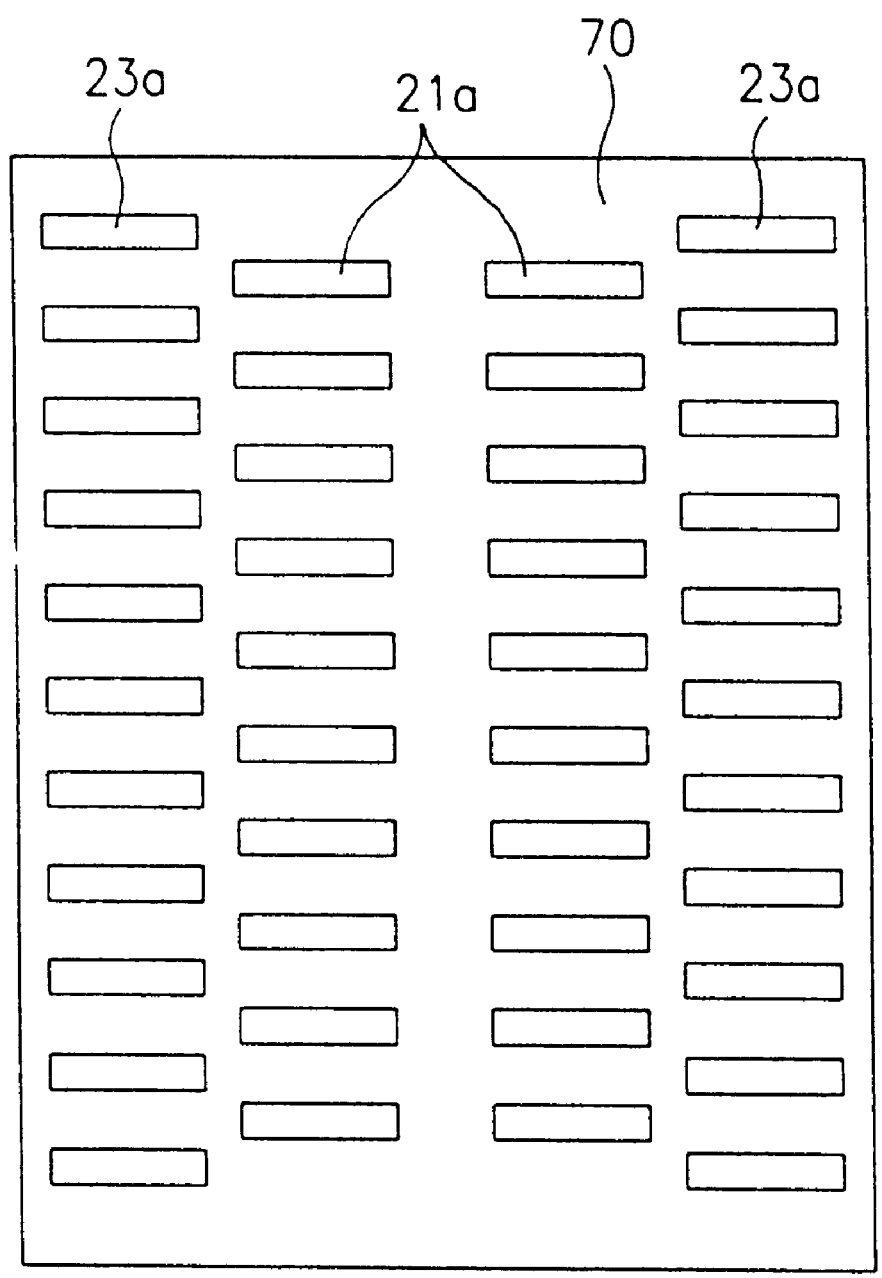
FIG. 5 is a bottom view illustrating a bottom lead semiconductor package embodying the present invention.

FIG. 5 illustrates a bottom view of a bottom lead semiconductor package according to the present invention. As shown therein, the lower surfaces of the bottom lead portions 21a and 23a are exposed to the outside of the package body. The multiple row arrangement allows more leads to connect to an external circuit than would be possible with a conventional bottom lead semiconductor package.

Figure 6:
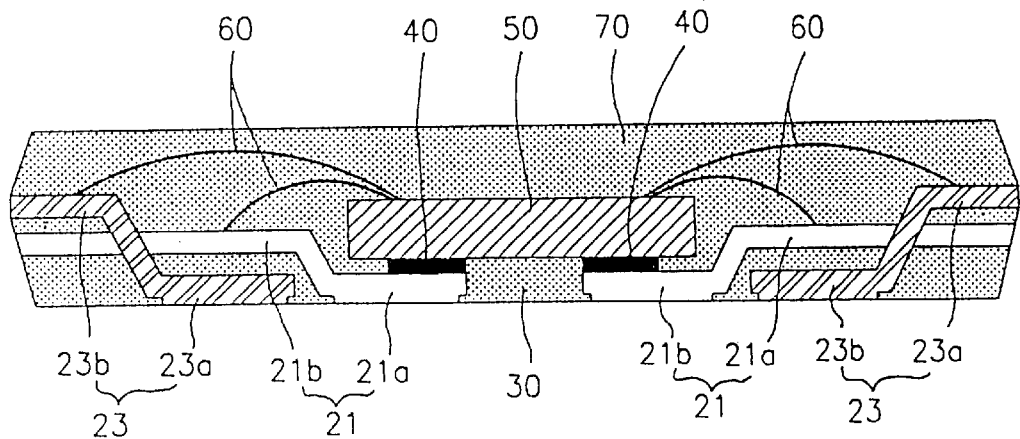
FIG. 6 is a vertical cross-sectional view illustrating another bottom lead semiconductor package embodying the invention.
Figure 7:
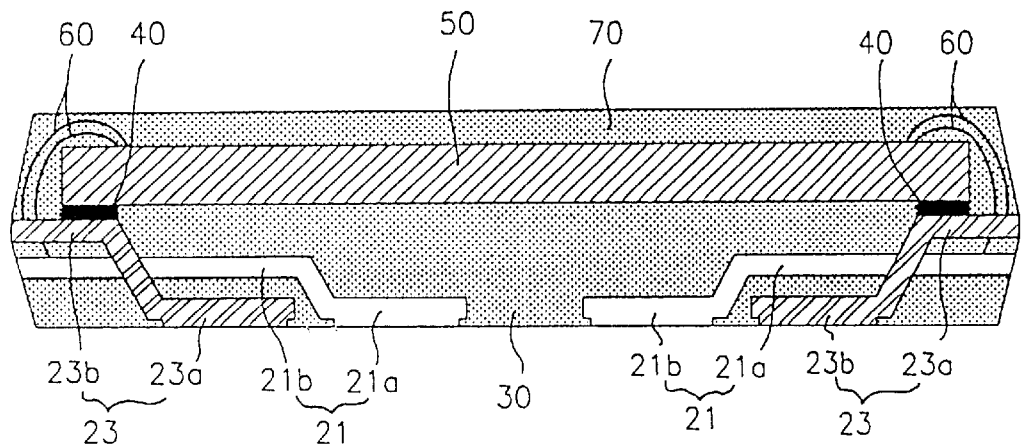
FIG. 7 is a vertical cross-sectional view illustrating another bottom lead semiconductor package embodying the invention.

Additionally, the semiconductor chip 50 is not limited to being mounted on the upper surfaces of the inner lead portions 21b of the first leads 21. The semiconductor chip 50 could also be mounted on the upper surfaces of the inner lead portions 23b of the second leads 23, as shown in FIG. 7. The semiconductor chip 50 could also be mounted on upper surfaces of the bottom lead portions 21a of the first leads 21, as shown in FIG. 6.

Figure 8:
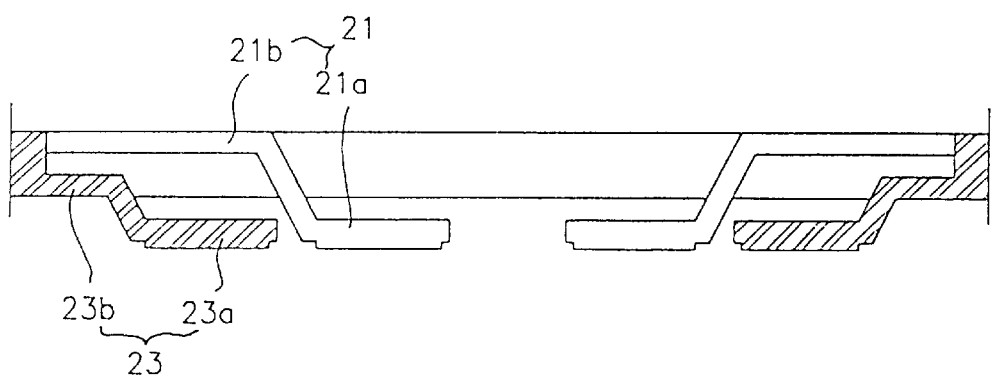
FIG. 8 is a vertical cross-sectional view of another lead frame embodying the invention.

Also, in other alternative embodiments of the invention, the upper surfaces of the inner lead portions 21b of the first leads 21 may extend above the upper surfaces of the inner lead portions 23b of the second leads, as shown in FIG. 8.

As described above, in a bottom lead frame and a bottom lead semiconductor package embodying the present invention, the first leads and the second leads do not interfere with each other, and the bottom lead portions are exposed in multiple rows on a lower surface of the molding portion, whereby it is possible to form a multiple row pin structure.

Although preferred embodiments of the present invention have been disclosed for illustrative purposes, those skilled in the art will appreciate that various modifications, additions and substitutions are possible, without departing from the scope and spirit of the invention as recited in the accompanying claims. For example, the present invention can be modified and be applied to other packages, such as a package described in U.S. Pat. No. 5,363,279 and stackable packages.

What is claimed is:

1. A bottom lead semiconductor package, comprising:
a plurality of first leads arranged opposite one another on both sides of a central portion of the package, wherein each of the first leads has a bottom lead portion and an inner lead portion that is bent from the bottom lead portion;
a plurality of second leads, wherein each of the second leads has a bottom lead portion and an inner lead portion bent from the bottom lead portion, wherein the bottom lead portions of the second leads are arranged outwardly of the bottom lead portions of the first leads, and wherein said first leads pass through a plane passing between longitudinal sides of neighboring second leads;
a semiconductor chip attached to at least one of the first leads and the second leads;
a plurality of conductive wires for electrically coupling the semiconductor chip with the first and second leads; and
a molding portion for packaging the first leads, the second leads, the semiconductor chip and the wires while exposing lower surfaces of the bottom lead portions of the first and second leads.

2. The package of claim 1, wherein the inner lead portions of the second leads are upwardly bent to a different height than the inner lead portions of the first leads.

3. The package of claim 1, wherein a width of the bottom lead portions of the first and second leads is greater than a width of the inner lead portions of the first and second leads.

4. The package of claim 1, wherein said semiconductor chip is mounted on upper surfaces of the bottom lead portions of the first leads.

5. The package of claim 1, wherein the semiconductor chip is mounted on upper surfaces of the inner lead portions of the first leads by an insulating adhesive.

6. The package of claim 1, wherein the conductive wires include a plurality of first conductive wires and a plurality of second conductive wires.

7. The package of claim 1, wherein the bottom lead portions of the first and second leads extend inwardly of the inner lead portions of said first and second leads.

8. The package of claim 6, wherein the first and second conductive wires are electrically coupled to the inner portions of the first and second leads, respectively.

9. A lead frame, comprising:

a plurality of first leads arranged on opposite sides of a central area, wherein each of the first leads includes a bottom portion and an inner portion; and a plurality of second leads arranged on opposite sides of the central area, wherein each of the second leads includes a bottom portion and an inner portion, wherein the bottom portions of the seconds leads are arranged outwardly of the bottom portions of the first leads, wherein the inner portion of at least one of the first leads is arranged between longitudinal sides of a pair of adjacent second leads, wherein the inner portions of the second leads extend upwardly from the bottom portions of the second leads to a different height than a height of the inner portions of the first leads, and wherein a width of the bottom portions of the first and second leads is greater than a width of the inner portions of the first and second leads.

10. The lead frame of claim 9, wherein the inner portions of the first leads extend upwardly from the bottom portions of the first leads.

11. The lead frame of claim 9, wherein each of the first leads is arranged between a corresponding pair of the second leads.

12. The lead frame of claim 9, wherein the bottom portions of the first and second leads are substantially co-planer.

13. A package, comprising:

a plurality of first leads arranged on opposite sides of a central area, wherein each of the first leads includes a bottom portion and an inner portion;

a plurality of second leads arranged on opposite sides of the central area, wherein each of the second leads includes a bottom portion and an inner portion, wherein the bottom portions of the second leads are arranged outwardly from the bottom portions of the first leads;

a chip mounted on upper surfaces of one of the first leads and the second leads;

a plurality of conductive media electrically coupling the chip to the first and second leads; and molding resin packaging the first leads, the second leads, the chip and the plurality of conductive media such that bottom surfaces of the bottom portions of the first and second leads are exposed.

14. The package of claim 13, wherein a width of the bottom portions of the first and second leads is greater than a width of the inner portions of the first and second leads.

15. The package of claim 13, wherein the inner portions of the second leads extend upwardly from the bottom portions of the second leads.

16. The package of claim 13, wherein the inner portions of the first leads extend above the bottom portions of the first leads.

17. The package of claim 13, wherein the inner portions of the second leads extend upwardly to a different height than a height of the inner portions of the first leads.

18. The package of claim 13, wherein each of the first leads is arranged between a corresponding pair of adjacent second leads.

19. The package of claim 13, wherein the chip is mounted on upper surfaces of the inner portions of the first leads.

20. The package of claim 13, wherein the chip is mounted on upper surfaces of the bottom portions of the first leads.

21. The package of claim 13, wherein the chip is mounted on upper surfaces of the inner portions of the second leads.

22. The package of claim 13, wherein a height of the inner lead portions of the first leads is greater than a height of the inner lead portions of the second leads.

23. A lead frame, comprising:

a plurality of first leads arranged on first and second opposing sides of a central area, wherein each of the first leads includes a bottom portion and an inner portion;

a plurality of second leads arranged on the first and second opposing sides of the central area, wherein each of the second leads includes a bottom portion and an inner portion, wherein the bottom portions of the second leads are arranged outwardly from the bottom portions of the first leads, wherein the bottom portions of the first leads are substantially co-planer with the bottom portions of the second leads, wherein the inner portions of the first leads are arranged between longitudinal sides of adjacent pairs of second leads, and wherein the inner portions of the first leads extend upwardly from the bottom portions of the first leads to a height that is equal to or greater than a height of the inner portions of the second leads.

24. A lead frame, comprising:

a plurality of first leads arranged on opposite sides of a central area, wherein each of the first leads includes a bottom portion and an inner portion; and a plurality of second leads arranged on opposite sides of the central area, wherein each of the second leads includes a bottom portion and an inner portion, wherein the bottom portions of the seconds leads are arranged outwardly of the bottom portions of the first leads, and wherein at least one of the first leads passes through a plane passing between longitudinal sides of a pair of adjacent second leads.

25. A lead frame, comprising:

a plurality of first leads arranged on opposite sides of a central area, wherein each of the first leads includes a bottom portion and an inner portion; and a plurality of second leads arranged on opposite sides of the central area, wherein each of the second leads includes a bottom portion and an inner portion, wherein the bottom portions of the seconds leads are arranged outwardly of the bottom portions of the first leads, wherein the inner portion of at least one of the first leads is arranged between longitudinal sides of a pair of adjacent second leads, and wherein the bottom portions of the first and second leads extend inwardly from the inner portions of the first and second leads, respectively.

26. A bottom lead semiconductor package, comprising:
- a plurality of first leads arranged opposite one another on sides of a central portion of the package, wherein each of the first leads has a bottom lead portion and an inner lead portion that is bent from the bottom lead portion;
- a plurality of second leads, wherein each of the second leads has a bottom lead portion and an inner lead portion that is bent from the bottom lead portion, wherein the bottom lead portions of the second leads are arranged outwardly of the bottom lead portions of the first leads, and wherein said first leads are inserted between neighboring second leads;
- a semiconductor chip mounted on a surface of at least one of the first and second leads;
- a plurality of conductive media for electrically coupling the semiconductor chip to the first and second leads; and
- a molding portion configured to package the first leads, the second leads, the semiconductor chip and the conductive media, wherein the first and second leads are exposed on a bottom surface of the molding portion.

* * * * *